(12) United States Patent
Streppel et al.

(10) Patent No.: US 11,233,089 B2
(45) Date of Patent: Jan. 25, 2022

(54) OPTOELECTRONIC COMPONENT

(71) Applicant: OSRAM Opto Semiconductors GmbH, Regensburg (DE)

(72) Inventors: Ulrich Streppel, Regensburg (DE); Désirée Queren, Neutraubling (DE)

(73) Assignee: OSRAM OLED GmbH, Regensburg (DE)

( * ) Notice: Subject to any disclaimer, the term of this patent is extended or adjusted under 35 U.S.C. 154(b) by 309 days.

(21) Appl. No.: 16/466,509

(22) PCT Filed: Dec. 18, 2017

(86) PCT No.: PCT/EP2017/083262
§ 371 (c)(1),
(2) Date: Jun. 4, 2019

(87) PCT Pub. No.: WO2018/114769
PCT Pub. Date: Jun. 28, 2018

(65) Prior Publication Data
US 2020/0083282 A1 Mar. 12, 2020

(30) Foreign Application Priority Data
Dec. 19, 2016 (DE) ...................... 10 2016 124 871.1

(51) Int. Cl.
*H01L 33/58* (2010.01)
*H01L 27/15* (2006.01)
*H01L 25/075* (2006.01)
*H01L 33/50* (2010.01)

(52) U.S. Cl.
CPC ........ *H01L 27/156* (2013.01); *H01L 25/0753* (2013.01); *H01L 33/58* (2013.01); *H01L 33/505* (2013.01)

(58) Field of Classification Search
CPC .......................... H01L 25/0753; H01L 33/58
See application file for complete search history.

(56) References Cited

U.S. PATENT DOCUMENTS

| 8,070,329 B1 | 12/2011 | Bechtel et al. |
| 2005/0174768 A1 | 8/2005 | Conner |

(Continued)

FOREIGN PATENT DOCUMENTS

| DE | 10 2007 043 192 A1 | 3/2009 |
| DE | 10 2009 047 788 | 3/2011 |

(Continued)

*Primary Examiner* — Trang Q Tran
(74) *Attorney, Agent, or Firm* — DLA Piper LLP (US)

(57) ABSTRACT

An optoelectronic component includes a light emitter including a multiplicity of segments, wherein each segment of the light emitter includes a multiplicity of image points configured to emit light, and an optical element configured to image light emitted by the light emitter into a target region, light emitted by the individual segments of the light emitter is superimposed in the target region, the optical element is subdivided into a number of segments corresponding to a number of segments of the light emitter, each segment of the optical element is respectively arranged over a segment of the light emitter, and the segments of the optical element are respectively configured as double-sided aspherical lenses.

14 Claims, 4 Drawing Sheets

(56) References Cited

U.S. PATENT DOCUMENTS

| | | | |
|---|---|---|---|
| 2012/0068615 A1* | 3/2012 | Duong | C09K 11/0883 |
| | | | 315/192 |
| 2012/0189291 A1 | 7/2012 | von Malm et al. | |
| 2018/0320852 A1* | 11/2018 | Mandl | F21S 41/322 |
| 2019/0074413 A1 | 3/2019 | Streppel | |

FOREIGN PATENT DOCUMENTS

| | | |
|---|---|---|
| DE | 10 2016 104 385 A1 | 9/2017 |
| EP | 2 615 367 A1 | 7/2013 |
| JP | 2014-082236 A | 5/2014 |

* cited by examiner

OPTOELECTRONIC COMPONENT

TECHNICAL FIELD

This disclosure relates to an optoelectronic component.

BACKGROUND

It is known to use optoelectronic components having pixelated light sources to generate structured illumination patterns. The light emitted by the pixelated light source is imaged by projection optics into a target region. Such an optoelectronic component is known, for example, from DE 10 2016 104 385.

SUMMARY

We provide an optoelectronic component including a light emitter including a multiplicity of segments, wherein each segment of the light emitter includes a multiplicity of image points configured to emit light, and an optical element configured to image light emitted by the light emitter into a target region, light emitted by the individual segments of the light emitter is superimposed in the target region, the optical element is subdivided into a number of segments corresponding to a number of segments of the light emitter, each segment of the optical element is respectively arranged over a segment of the light emitter, and the segments of the optical element are respectively configured as double-sided aspherical lenses.

We also provide an optoelectronic component including a light emitter including a multiplicity of segments, wherein each segment of the light emitter includes a multiplicity of image points configured to emit light, and an optical element configured to image light emitted by the light emitter into a target region, wherein light emitted by the individual segments of the light emitter is superimposed in the target region, the optical element is subdivided into a number of segments corresponding to the number of segments of the light emitter, each segment of the optical element is respectively arranged over a segment of the light emitter, the segments of the optical element are respectively configured as double-sided aspherical lenses, each image point of each segment of the light emitter corresponds to respectively one image point of each other segment of the light emitter, and the optoelectronic component is configured to drive corresponding image points together.

Figure 1:
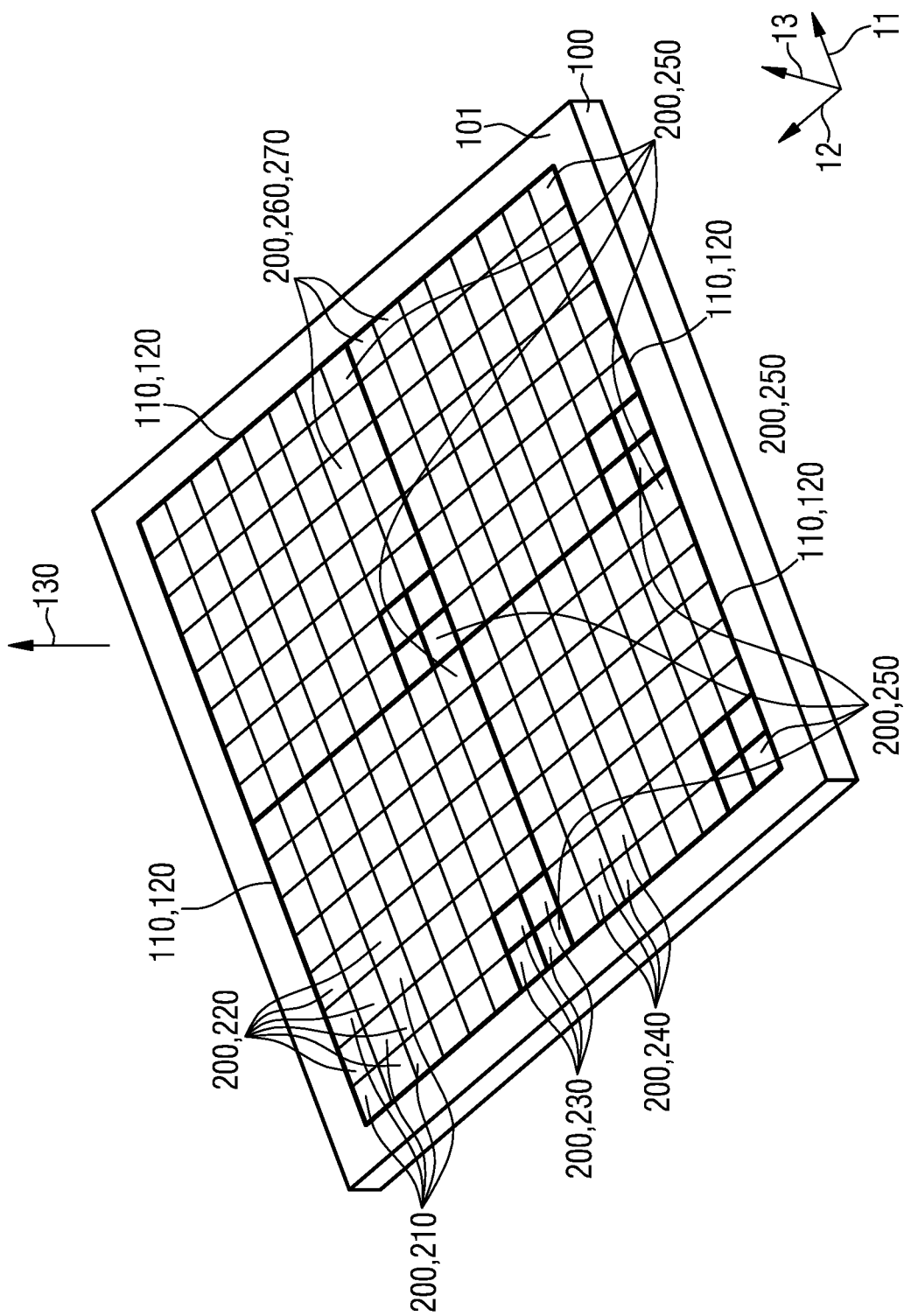
FIG. 1 schematically shows a perspective view of a light emitter according to a first example.

LIST OF REFERENCES 10 optoelectronic component
11 longitudinal direction
12 transverse direction
13 perpendicular direction
100 light emitter
101 upper side
110 segment
120 two-dimensional matrix arrangement
130 light
200 image point
210 image point of a first type
220 image point of a second type
230 activated image point
240 nonactivated image point
250 corresponding image points
260 two-dimensional matrix arrangement
270 optoelectronic semiconductor chip
300 optical element
301 upper side
302 lower side
310 segment
320 two-dimensional matrix arrangement
330 lens
400 target region

DETAILED DESCRIPTION

Our optoelectronic component comprises a light emitter comprising a multiplicity of segments. Each segment of the light emitter may comprise a multiplicity of image points configured to emit light. The optoelectronic component furthermore comprises an optical element configured to image light emitted by the light emitter into a target region. Light emitted by the individual segments of the light emitter may be superimposed in the target region.

This optoelectronic component makes it possible to generate a structured light pattern in a target region. The structure of the light pattern may be established by selective driving of the individual image points of the light emitter. The light emitted by the light emitter is imaged by the optical element of the optoelectronic component into the target region.

Advantageously, the optical element may have a very small overall height in a direction perpendicular to the upper side of the light emitter. This is achieved by subdivision of the light emitter into a multiplicity of segments.

A light pattern with a high luminance can advantageously be produced because the individual segments of the light emitter of this optoelectric component is superimposed on this optoelectronic component in the target region. Superposition of the light emitted by the individual segments in the target region may also reinforce color homogeneity of the light pattern that can be generated by the optoelectronic component, and permit adjustment of the color of the emitted light in the target region.

The optical element may be subdivided into a number of segments corresponding to the number of segments of the light emitter. Each segment of the optical element may be respectively arranged over a segment of the light emitter. Advantageously, the plurality of segments of the optical element form individual projection channels. Each of these segments of the light emitter only needs to image a segment of the optical element having a reduced area compared to the overall optical element. In this way, the segments of the light emitter only need to have a small height in a direction perpendicular to the upper side of the light emitter. This makes it possible to configure the optical element with a very small overall height in a direction perpendicular to the upper side of the light emitter. In this way, the entire optoelectronic component may advantageously have very compact outer dimensions.

The segments of the optical element may respectively be configured as double-sided aspherical lenses. Configuration of the segments of the optical element as aspherical lenses advantageously makes it possible to image light emitted by the segments of the light emitter of the optoelectronic component into a target region whose geometry differs from the geometry of the segments of the light emitter. For example, the segments of the optical element configured as double-sided aspherical lenses may make it possible to image light emitted by square segments of the light emitter of the optoelectronic component into a rectangular target region.

The segments of the optical element may respectively be configured as double-sided toric (toroidal) lenses. Advantageously, the lenses of the segments of the optical element of this optoelectronic component have different curvatures in two mutually perpendicular spatial directions so that light emitted by the segments of the light emitter is refracted to different extents into the two spatial directions by the segments of the optical element.

The lenses of the segments of the optical element may respectively be tilted relative to a direction perpendicular to an upper side of the light emitter. This makes it possible to image light emitted by the light emitter of the optoelectronic component into a target region shifted relative to a symmetry axis of the optoelectronic component.

The image points in each segment of the light emitter may be arranged in a two-dimensional matrix arrangement. Advantageously, image points thus arranged allow simple and effective generation of a structured light pattern.

The light emitter may comprise image points of a first type and image points of a second type. The image points of the first type may, for example, be configured to emit colored light with a different light color, or white light with a different color temperature, than the image points of the second type. This makes it possible to generate by the optoelectronic component a structured light pattern whose light comprises a mixture of light emitted by image points of the first type and image points of the second type. This makes it possible to adjust the color of the light pattern.

The image points of the first type may be configured to emit light with a warm-white color temperature. In this example, the image points of the second type are configured to emit light with a cold-white color temperature. Warm-white light may, for example, be light with a color temperature of between 2000 K and 3500 K, for example, light with a color temperature of 2200 K. Cold-white light may, for example, be light with a color temperature of 3500 K to 7000 K, for example, light with a color temperature of 5500 K.

Image points of the first type and image points of the second type may alternate in a checkerboard fashion in each segment of the light emitter. Advantageously, particularly homogeneous mixing of the light emitted by image points of the first type with light emitted by image points of the second type may be achieved in this way.

Each segment of the light emitter may comprise only either image points of the first type or image points of the second type. Advantageously, the light emitter therefore has a particularly simple structure.

Each image point may comprise an optoelectronic semiconductor chip. For example, each image point of the optoelectronic component may comprise a light-emitting diode chip. Advantageously, the light emitter of the optoelectronic component may therefore be configured with compact outer dimensions. Furthermore, the light emitter of the optoelectronic component may therefore be configured to emit light with a high luminous intensity. The light emitter of the optoelectronic component may therefore also have a high efficiency.

The segments of the light emitter may be arranged in a two-dimensional matrix arrangement. Advantageously, the light emitter therefore has a simple regular structure.

The light emitter may comprise four segments arranged in a 2×2 arrangement. Advantageously, a light emitter comprising four segments arranged in a 2×2 arrangement represents a good compromise between compact outer dimensions of the light emitter and a high luminous intensity achievable by the light emitter.

Each image point of each segment of the light emitter can be driven independently of the other image points of the respective segment. Advantageously, the optoelectronic component therefore allows a particularly free configuration of a shape of a structured light pattern emitted by the optoelectronic component.

Each image point of each segment of the light emitter may correspond with respectively one image point of each other segment of the light emitter. In this example, the optoelectronic component is configured to drive corresponding image points together. Advantageously, the driving of the optoelectronic component is thereby simplified since overall fewer individual elements are to be driven independently of one another.

The above-described properties, features and advantages, and the way in which they are achieved, will become more clearly and readily comprehensible in conjunction with the following description of examples, which will be explained in more detail in connection with the drawings.

FIG. 1 shows a schematic perspective representation of a first example of a light emitter 100. The light emitter 100 comprises an essentially planar upper side 101 arranged in a plane spanned by a longitudinal direction 11 and a transverse direction 12 perpendicular to the longitudinal direction 11. A direction 13 perpendicular to the upper side 101 of the light emitter 100 is oriented perpendicularly to the longitudinal direction 11 and perpendicularly to the transverse direction 12.

The light emitter 100 is subdivided into a plurality of segments 110. The segments 110 are arranged next to one another in the plane spanned by the longitudinal direction 11 and the transverse direction 12. In the example shown in FIG. 1, the light emitter 100 comprises four segments 110. The light emitter 100 can, however, also comprise a different number of segments 110.

The segments 110 of the light emitter 100 are arranged in a two-dimensional matrix arrangement 120. In the example shown in FIG. 1, the four segments 110 are arranged in a 2×2 arrangement, the axes of which are oriented parallel to the longitudinal direction 11 and the transverse direction 12. The segments 110 of the light emitter 100 can, however, also be arranged in a different arrangement.

Each segment 110 of the light emitter 100 comprises a multiplicity of image points 200 configured to emit light 130. The image points 200 in this example emit the light 130 on the upper side 101 of the light emitter 100 in the direction 13 perpendicular to the upper side 101 of the light emitter 100. The image points 200 may also be referred to as pixels. The image points 200 may have a square or other rectangular shape. The image points 200 may also have a nonrectangular shape. In the example represented, all the image points 200 are configured identically, although this is not absolutely necessary. For example, some image points 200 may be larger than other image points 200.

Each image point 200 of the light emitter 100 may comprise an optoelectronic semiconductor chip 270 configured to emit light. For example, each image point 200 of the light emitter 100 may comprise a light-emitting diode chip. In addition, each image point 200 may comprise a wavelength-converting element configured to convert light emitted by the optoelectronic semiconductor chip 270 of the respective image point 200 at least partially into light of a different wavelength. In this way, for example, the image point 200 may be configured to emit white light 130.

In each segment 110 of the light emitter 100, the image points 200 are arranged in a two-dimensional matrix arrangement 260. In the example shown in FIG. 1, the two-dimensional matrix arrangement 260 of each segment 100 of the light emitter 100 comprises 8×8 image points 200. This, however, is merely an example. The segments 110 of the light emitter 100 may also be configured with a different number of image points 200. The two-dimensional matrix arrangement 260 of the image points 200 need not be square.

It is expedient for the light emitter 100 to comprise image points 200, 210 of a first type and image point 200, 220 of a second type. The image points 200, 210 of the first type and the image points 200, 220 of the second type may differ by the color or by the color temperature of the light 130 emittable by the image points 200. For example, the image points 200, 210 of the first type may be configured to emit colored light with a first light color, while the image points 200, 220 of the second type are configured to emit colored light with a different second light color. It is also possible for the image points 200, 210 of the first type to be configured to emit white light with a first color temperature, while the image points 200, 220 of the second type are configured to emit white light with a second color temperature. For example, the image points 200, 210 of the first type may be configured to emit light with a warm-white color temperature. The image points 200, 220 of the second type may, for example, be configured to emit white light with a cold-white color temperature. White light with a warm-white light color may, for example, have a color temperature of 2000 K to 3500 K, for example, a color temperature of 2200 K. White light with a cold-white light color may, for example, have a color temperature of 3500 K to 7000 K, for example, a color temperature of 5500 K.

In the light emitter 100 shown in FIG. 1, image points 200, 210 of the first type and image points 200, 220 of the second type alternate in a checkerboard fashion in each segment 110 of the light emitter 100. This means that in each segment 110 of the light emitter 100, in each row of the two-dimensional matrix arrangement 260 of image points 200 and in each column of the two-dimensional matrix arrangement 260 of image points 200, an image point 200, 210 of the first type and an image point 200, 220 of the second type follow one another alternately. In this example, all the segments 110 of the light emitter 100 are constructed identically. Since the two-dimensional matrix arrangement 260 of image points 200 comprises an even number of rows and an even number of columns in each segment 110 of the light emitter 100, it follows that in the light emitter 100 of FIG. 1 there are exactly as many image points 200, 210 of the first type as image points 200, 220 of the second type.

It is expedient that each image point 200 of each segment 110 of the light emitter 100 can be driven independently of the other image points 200 of the respective segment 110. This means that in each segment 110 of the light emitter 100, all the image points 200 can be activated independently of one another to emit light. In FIG. 1 by way of example, in each segment 110 of the light emitter 100 some image points 200 are represented as activated image points 200, 230 that emit light, while the other image points 200 are represented as nonactivated image points 200, 240 that do not emit any light at the instant represented. Because all the image points 200 of a segment 110 of the light emitter 100 can be driven independently of one another, it is possible to structure the light 130 emitted by a segment 110 of the light emitter 100, i.e. to configure the shape of a light pattern emitted by this segment 110 of the light emitter 100.

Since all the segments 110 of the light emitter 100 are constructed identically, for each image point 200 of a segment 110 of the light emitter 100 there are respectively corresponding image points 200, 250 in each other segment 110 of the light emitter 100. For example, all image points 200 arranged in the lower left corners of each segment 110 of the light emitter 100 form mutually corresponding image points 200, 250. Likewise, all image points 200 arranged in the upper right corners of each segment 110 of the light emitter 100 form mutually corresponding image points 200, 250.

An optoelectronic component comprising the light emitter 100 may be configured such that corresponding image points 200, 250 of all the segments 110 of the light emitter 100 are always driven together. In this example, corresponding image points 200, 250 of the segments 110 of the light emitter 100 can only be activated and deactivated together. For example, an image point 200 arranged in a lower left corner of a segment 110 of the light emitter 100 may then only be activated or deactivated together with the image points 200 in the lower left corners of the other segments 110 of the light emitter 100.

In this example, all the segments 110 of the light emitter 100 always emit identical light patterns on the upper side 101 of the light emitter 100. By such coupling of the corresponding image points 200, 250 of the individual segments 110 of the light emitter 100, driving the light emitter 100 is advantageously simplified since only a number of elements corresponding to the number of image points 200 of a segment 110 of the light emitter 100 need to be driven independently of one another, and not the total number of image points 200 of the light emitter 100.

It is also possible that some of the segments 110 of the light emitter 100 are driven together, but the other segments 110 of the light emitter 100 can be driven independently of the segments 110 driven together.

Figure 2:
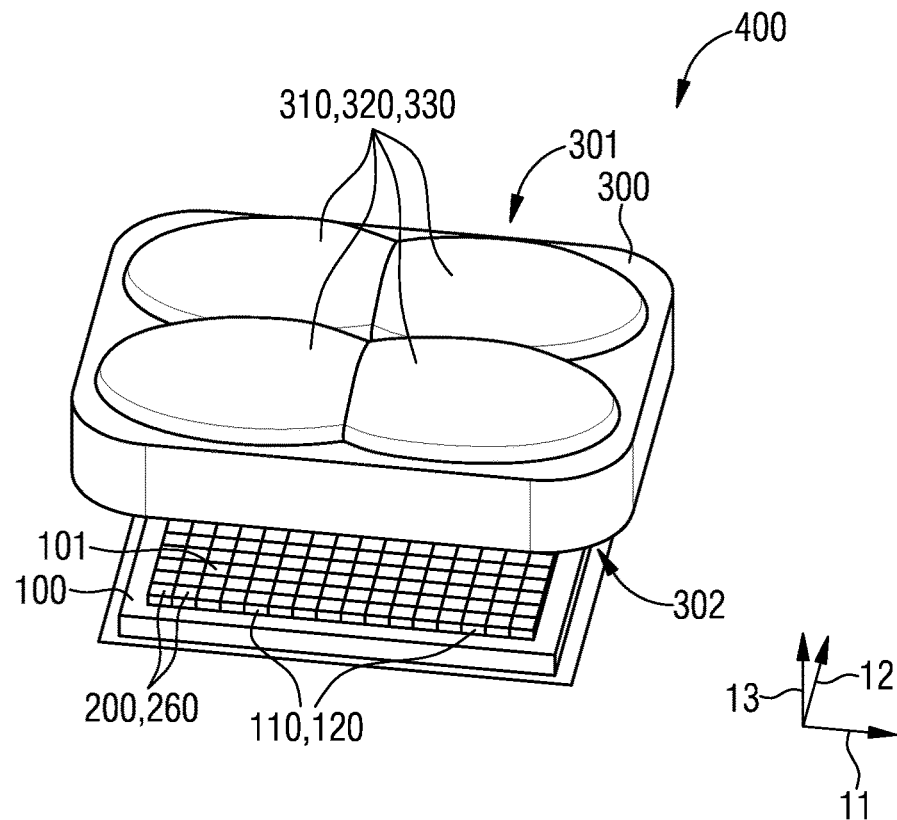
FIG. 2 schematically shows a perspective view of an optoelectronic component comprising the light emitter and an optical element.

FIG. 2 shows a schematic perspective representation of an optoelectronic component 10. The optoelectronic component 10 comprises the light emitter 100 described above with the aid of FIG. 1 and an optical element 300. In addition, the optoelectronic component 10 may comprise further component parts not represented in FIG. 2 for the sake of clarity. For example, the optoelectronic component 10 may comprise a housing that holds the light emitter 100 and the optical element 300 in a fixed relative arrangement.

The optoelectronic component 10 is intended to emit structured light, i.e. a shapeable light pattern, into a target region 400 outside the optoelectronic component 10. The may optoelectronic component 10 can, for example, be intended to produce a flashlight for photographic recording and be integrated into a camera or into a cellphone.

The optical element 300 is arranged over the upper side 101 of the light emitter 100 in the perpendicular direction 13. The optical element 300 is configured to image light 130 emitted by the light emitter 100 on its upper side 101 into the target region 400. To this end, the optical element 300 comprises a light-refracting material, for example, a glass or a plastic. The optical element 300 may, for example, be produced by a molding method, for example, by injection molding.

Figure 3:
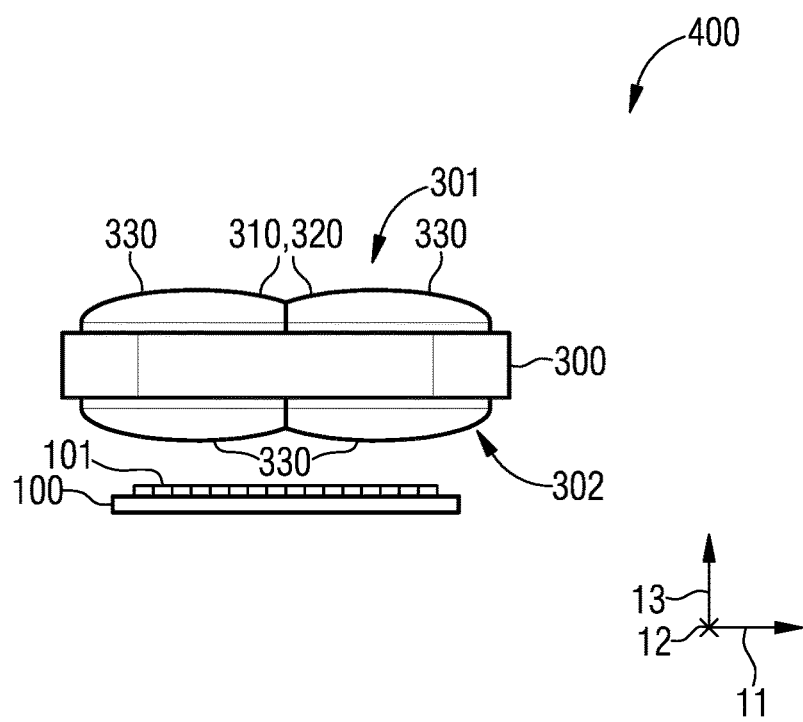
FIG. 3 schematically shows a first side view of the optoelectronic component.
Figure 4:
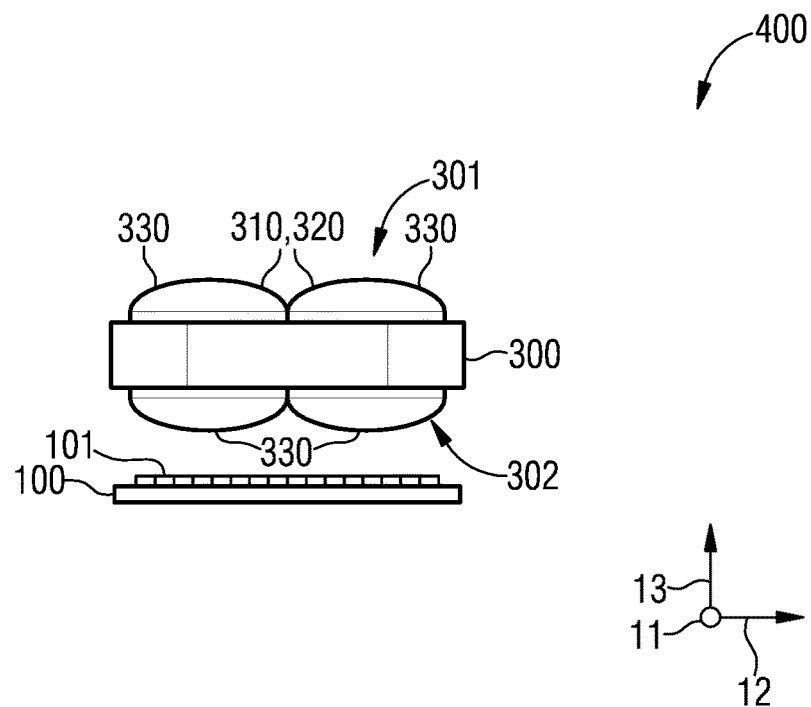
FIG. 4 schematically shows a second side view of the optoelectronic component.

FIG. 3 shows a schematic side view of the light emitter 100 and the optical element 300 of the optoelectronic component 10 from a first viewing direction. In the representation of FIG. 3, the plane of the paper is parallel to the longitudinal direction 11 and the perpendicular direction 13. FIG. 4 shows a schematic side view of the light emitter 100 and the optical element 300 of the optoelectronic component 10 from a second viewing direction. In the representation of FIG. 4, the plane of the paper is parallel to the transverse direction 12 and the perpendicular direction 13.

The optical element 300 of the optoelectronic component 10 is subdivided into a plurality of segments 310. The number of segments 310 of the optical element 300 in this example corresponds to the number of segments 110 of the light emitter 100. In the example shown in FIGS. 2, 3 and 4, the optical element 300 therefore comprises four segments 310.

The segments 310 of the optical element 300 are arranged in a two-dimensional matrix arrangement 320 corresponding to the two-dimensional matrix arrangement 120 of the segments 110 of the light emitter 100. In the example shown in FIGS. 2, 3 and 4, the two-dimensional matrix arrangement 320 of the segments 310 of the optical element 300 is therefore a 2×2 arrangement.

The optical element 300 of the optoelectronic component 10 is arranged over the upper side 101 of the light emitter 100 such that each segment 310 of the optical element 300 is respectively arranged over a segment 110 of the light emitter 100. Therefore, each segment 110 of the light emitter 100 is assigned a segment 310 of the optical element 300, and each segment 310 of the optical element 300 is assigned a segment 110 of the light emitter 100.

Each segment 310 of the optical element 300 is intended to image the light 130 emitted by the respectively assigned segment 110 of the light emitter 100 into the target region 400. In this example, the light 130 emitted by the individual segments 110 of the light emitter 100 is imaged by the segments 310 of the optical element 300 assigned to the segments 110 of the light emitter 100, into the target region 400 such that the light 130 emitted by the various segments 110 of the light emitter 100 is superimposed in the target region 400.

Figure 5:
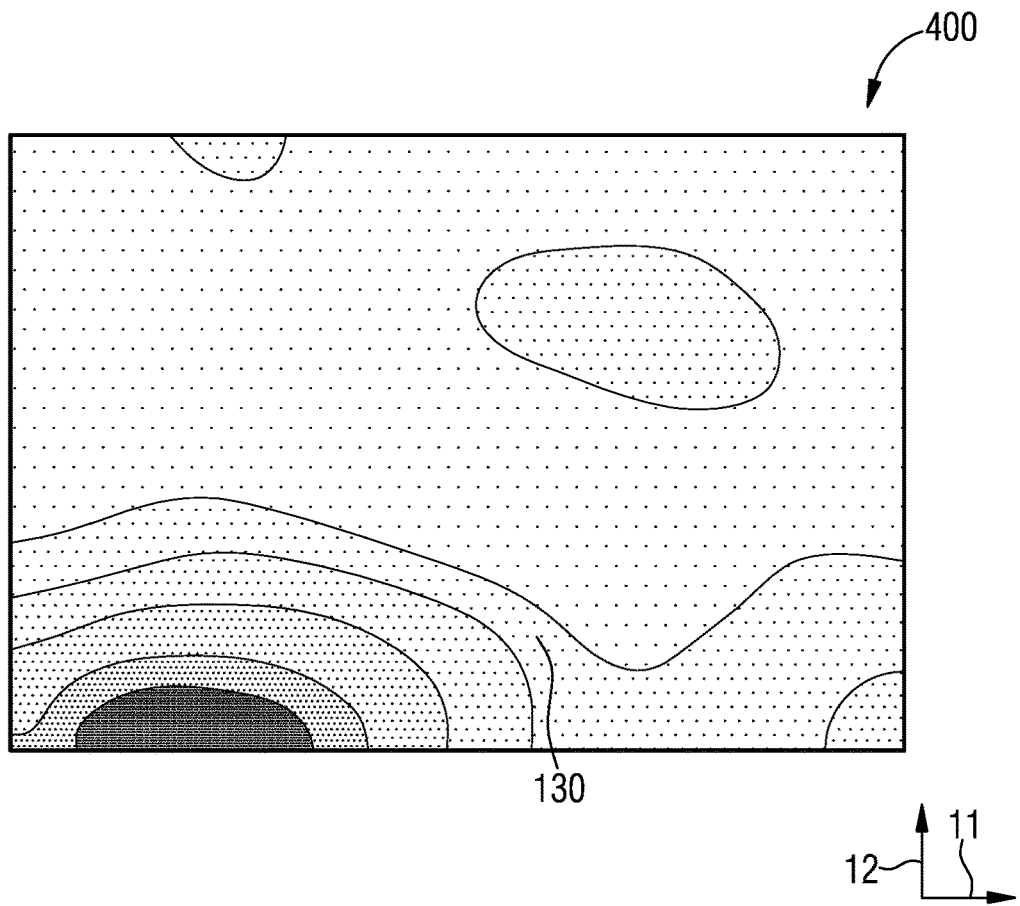
FIG. 5 schematically shows a view of a target region illuminated by the optoelectronic component.

FIG. 5 shows a highly schematized representation of the target region 400 illuminated by the optoelectronic component 10 in FIGS. 2 to 4. In the exemplary representation of FIG. 5, the target region 400 forms a rectangular surface parallel to the longitudinal direction 11 and the transverse direction 12 of the optoelectronic component 10, and that may, for example, be arranged at a distance of 1 m from the optoelectronic component 10 in the perpendicular direction 13.

Schematically represented in FIG. 5 is an illuminance distribution in the target region 400, resulting from the illumination of the target region 400 by the optoelectronic component 10. The illuminance distribution represented schematically in FIG. 5 is obtained when, in each segment 110 of the light emitter 100 of the optoelectronic component 10, respectively only four image points 200, 230 arranged close to a corner of the respective segment 110 of the light emitter 100 are activated, while all the other image points 200, 240 of all the segments 110 of the light emitter 100 of the optoelectronic component 10 are not activated. The light 130 emitted by the individual segments 110 of the light emitter 100 of the optoelectronic component 10 is superimposed in the target region 400 such that an increased illuminance is set up in a corner of the target region 400 compared with the other sections of the target region 400.

The optical element 300 comprises an upper side 301 and a lower side 302 opposite the upper side 301. The optical element 300 is arranged over the light emitter 100 such that the lower side 302 of the optical element 300 faces towards the upper side 101 of the light emitter 100.

The segments 310 of the optical element 300 are respectively configured as optical lenses 300. The optical lens 330 of each segment 310 of the optical element 300 is respectively configured as a double-sided converging lens with a convex shape on the upper side 301 of the optical element 300 and on the lower side 302 of the optical element 300.

The light emitter 100 and the optical element 300 of the optoelectronic component 10 may respectively have edge lengths of a few mm in the longitudinal direction 11 and in the transverse direction 12. The target region 400 may have a distance of, for example, 1 m from the optoelectronic component 10. Since the distance of the target region 400 from the optoelectronic component 10 is substantially greater than the size of the light emitter 100 and the optical element 300, the images that are imaged in the target region 400 by the individual segments 310 of the optical element, the segments 110 of the light emitter 100 are substantially superimposed in the target region 400.

In the example shown in FIG. 5, the target region 400 has a rectangular, non-square shape. In the example represented, however, the segments 110 of the light emitter 100 of the optoelectronic component 10 respectively have a square shape. To illuminate the non-square target region 400 with the light 130 emitted by the square segments 110 of the light emitter 100, the segments 310 of the optical element 300 of the optoelectronic component 10 are configured as double-sided aspherical lenses 330. Specifically, the segments 310 of the optical element 300 in the example shown in FIGS. 2, 3 and 4 are configured as double-sided toric (toroidal) lenses 330. The lenses 330 are therefore configured biconically, or bi-aspherically. In FIGS. 3 and 4, it can be seen that the optical lenses 330 of the segments 310 of the optical element 300 are curved less strongly in the plane formed by the longitudinal direction 11 and the perpendicular direction 13 than in the plane formed by the transverse direction 12 and the perpendicular direction 13. The segments 310 of the optical element 300 therefore image the light 130 emitted by the square segments 110 of the light emitter 100 into the rectangular target region 400.

The optical lenses 330 of the segments 310 of the optical element 300 of the optoelectronic component 10 may optionally be slightly defocused, to ensure that light 130 emitted by image points 200, 210 of the first type is always mixed with light 130 emitted by image points 200, 220 of the second type at all positions of the target region 400.

It is possible to tilt the optical axes of the optical lenses 330 of the segments 310 of the optical element 300 relative to the direction 13 perpendicular to the upper side 101 of the light emitter 100. In this example, the segments 310 of the optical element 300 image the light 130 emitted by the segments 110 of the light emitter 100 of the optoelectronic component 10 into a target region 400 which is shifted laterally relative to a midaxis of the optoelectronic component 10 parallel to the perpendicular direction 13.

Figure 6:
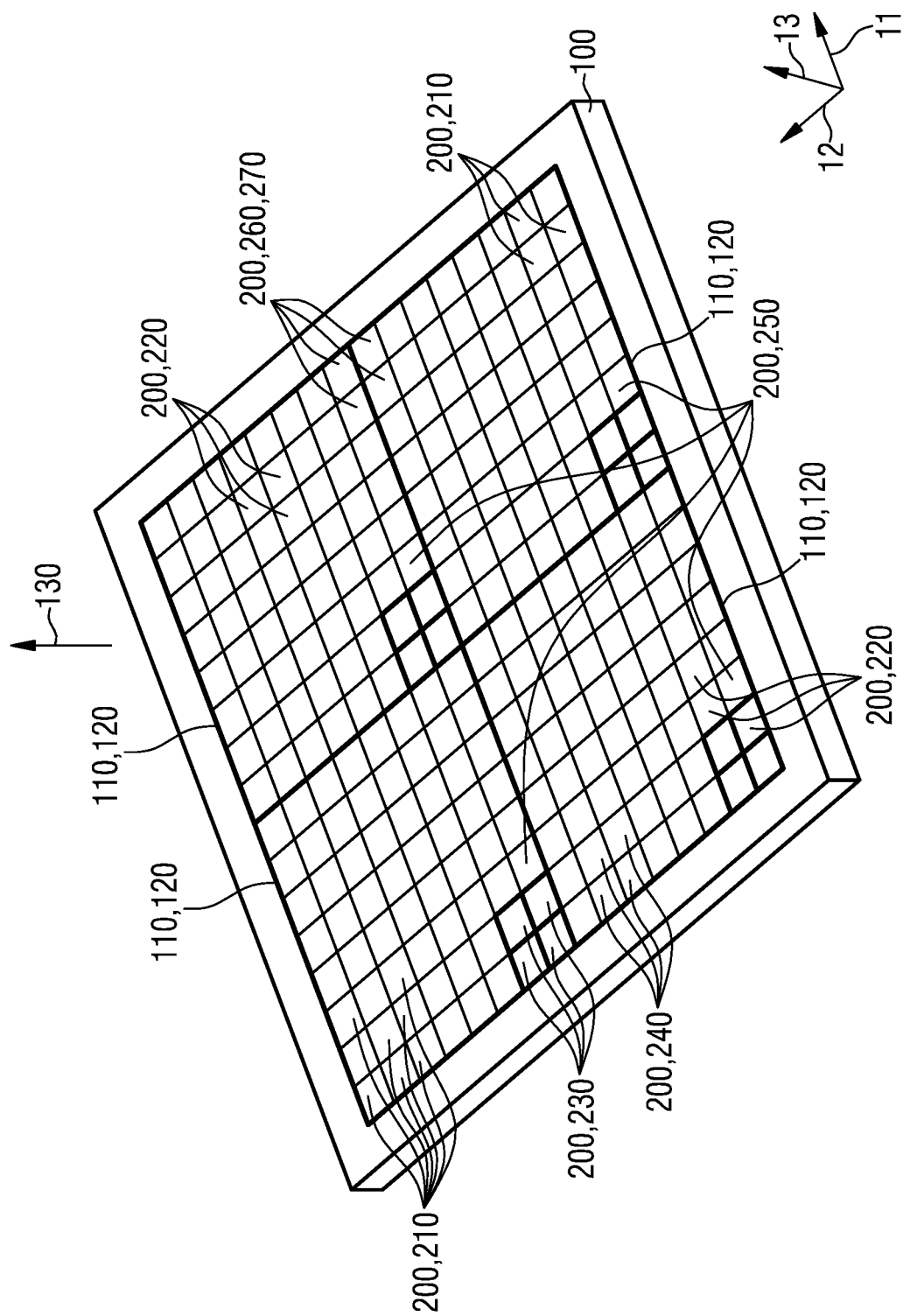
FIG. 6 schematically shows a perspective view of a light emitter according to a second example.

FIG. 6 shows a schematic perspective representation of a second example of the light emitter 100. The example of the light emitter 100 as shown in FIG. 6 has great similarities with the first example of the light emitter 100 as shown in FIG. 1. Component parts corresponding to one another are provided with the same references in FIGS. 1 and 6, and will not be described again in detail. Instead, only the differences between the example of the light emitter 100 as shown in FIG. 6 and the example of the light emitter 100 as shown in FIG. 1 will be presented below. In the optoelectronic component 10 shown in FIGS. 2, 3 and 4, the example of the light emitter 100 as shown in FIG. 6 may also be used instead of the example of the light emitter 100 as shown in FIG. 1.

In the example of the light emitter 100 as shown in FIG. 6, not every segment 110 of the light emitter 100 comprises image points 200, 210 of the first type and image points 200, 220 of the second type. Instead, each segment 110 of the light emitter 100 comprises only either image points 200, 210 of the first type or image points 200, 220 of the second type.

In the example shown in FIG. 6, two segments 110 of the light emitter 100 comprise only image points 200, 210 of the first type. The other two segments 110 of the light emitter 100 comprise only image points 200, 220 of the second type. In this example, the segments 110 of the light emitter 100 comprising only image points 200, 210 of the first type are arranged on one diagonal of the two-dimensional matrix arrangement 120. The segments 110 of the light emitter 100 comprising only image points 200, 220 of the second type are arranged on the other diagonal of the two-dimensional matrix arrangement 120 of the light emitter 100. In the light emitter 100 shown in FIG. 6, the segments 110 comprising only image points 200, 210 of the first type and the segments 110 comprising only image points 200, 220 of the second type therefore alternate in a checkerboard fashion in the two-dimensional matrix arrangement 120 of the segments 110.

If the example of the light emitter 100 as shown in FIG. 6 is used in the optoelectronic component 10, the optical lenses 330 of the segments 310 of the optical element 300 of the optoelectronic component 10 do not need to be defocused since in the example of the distribution shown in FIG. 6, of the image points 200, 210 of the first type and the image points 200, 220 of the second type, light 130 emitted by image points 200, 210 of the first type and by image points 200, 220 of the second type is always mixed together at every point of the target region 400 even without defocused optical lenses 330.

In another example of the light emitter 100, the image points 200, 210 of the first type and image points 200, 220 of the second type can be distributed in yet another way over the light emitter 100. In this example, the number of image points 200, 210 of the first type may differ from the number of image points 200, 220 of the second type. The light emitter 100 may also comprise only image points 200 of one single type or more than two different types of image points 200.

Our components have been illustrated and described in detail with the aid of preferred examples. This disclosure is not, however, restricted by the examples disclosed. Rather, other examples may be derived therefrom by those skilled in the art without departing from the protective scope of the appended claims.

This application claims priority of DE 10 2016 124 871.1, the subject matter of which is incorporated herein by reference.

The invention claimed is:

1. An optoelectronic component comprising:
a light emitter comprising a multiplicity of segments, wherein each segment of the light emitter comprises a multiplicity of image points configured to emit light, and
an optical element configured to image light emitted by the light emitter into a target region,
light emitted by individual segments of the light emitter is superimposed in the target region,
the optical element is subdivided into a number of segments corresponding to a number of segments of the light emitter,
each segment of the optical element is respectively arranged over a segment of the light emitter, and
the segments of the optical element are respectively configured as double-sided aspherical lenses.

2. The optoelectronic component according to claim 1, wherein the segments of the optical element are respectively configured as double-sided toric lenses.

3. The optoelectronic component according to claim 1, wherein the lenses of the segments of the optical element are respectively tilted relative to a direction perpendicular to an upper side of the light emitter.

4. The optoelectronic component according to claim 1, wherein the image points in each segment of the light emitter are arranged in a two-dimensional matrix arrangement.

5. The optoelectronic component according to claim 1, wherein the light emitter comprises image points of a first type and image points of a second type.

6. The optoelectronic component according to claim 5, wherein the image points of the first type are configured to emit light with a warm-white color temperature, and the image points of the second type are configured to emit light with a cold-white color temperature.

7. The optoelectronic component according to claim 5, wherein image points of the first type and image points of the second type alternate in a checkerboard pattern in each segment of the light emitter.

8. The optoelectronic component according to claim 5, wherein each segment of the light emitter comprises only either image points of the first type or image points of the second type.

9. The optoelectronic component according to claim 1, wherein each image point comprises an optoelectronic semiconductor chip.

10. The optoelectronic component according to claim 1, wherein the segments of the light emitter are arranged in a two-dimensional matrix arrangement.

11. The optoelectronic component according to claim 10, wherein the light emitter comprises four segments arranged in a 2×2 arrangement.

12. The optoelectronic component according to claim 1, wherein each image point of each segment of the light emitter can be driven independently of the other image points of the respective segment.

13. The optoelectronic component according to claim 1, wherein each image point of each segment of the light emitter corresponds to respectively one image point of each other segment of the light emitter, and the optoelectronic component is configured to drive corresponding image points together.

14. An optoelectronic component comprising:
a light emitter comprising a multiplicity of segments, wherein each segment of the light emitter comprises a multiplicity of image points configured to emit light, and
an optical element configured to image light emitted by the light emitter into a target region, wherein light emitted by individual segments of the light emitter is superimposed in the target region, the optical element is subdivided into a number of segments corresponding to the number of segments of the light emitter, each segment of the optical element is respectively arranged over a segment of the light emitter, the segments of the optical element are respectively configured as double-sided aspherical lenses, each image point of each segment of the light emitter corresponds to respectively one image point of each other segment of the light emitter, and the optoelectronic component is configured to drive corresponding image points together.

* * * * *